US007355418B2

(12) United States Patent
Brunner et al.

(10) Patent No.: US 7,355,418 B2
(45) Date of Patent: Apr. 8, 2008

(54) CONFIGURABLE PROBER FOR TFT LCD ARRAY TEST

(75) Inventors: Matthias Brunner, Kirchheim (DE); Shinichi Kurita, San Jose, CA (US); Ralf Schmid, Poing (DE); Fayez E. Abboud, Pleasanton, CA (US); Benjamin Johnston, Los Gatos, CA (US); Paul Bocian, Saratoga, CA (US); Emanuel Beer, San Jose, CA (US)

(73) Assignee: Applied Materials, Inc., Santa Clara, CA (US)

( * ) Notice: Subject to any disclaimer, the term of this patent is extended or adjusted under 35 U.S.C. 154(b) by 5 days.

(21) Appl. No.: 10/903,216

(22) Filed: Jul. 30, 2004

(65) Prior Publication Data

US 2005/0179452 A1 Aug. 18, 2005

Related U.S. Application Data

(63) Continuation-in-part of application No. 10/889,695, filed on Jul. 12, 2004, which is a continuation-in-part of application No. 10/778,982, filed on Feb. 12, 2004, now Pat. No. 6,833,717.

(51) Int. Cl.
*G01R 31/305* (2006.01)

(52) U.S. Cl. .................................................... 324/751

(58) Field of Classification Search ................. 324/751
See application file for complete search history.

(56) References Cited

U.S. PATENT DOCUMENTS 3,787,768 A * 1/1974 Kubota et al. .............. 324/754

(Continued)

FOREIGN PATENT DOCUMENTS

DE 3636316 5/1989

(Continued)

OTHER PUBLICATIONS

Brunner, et al., "Development of Puma 5500/10K Platform", AKTNews, vol. 5, Jan. 2001, p. 13-14.

(Continued)

*Primary Examiner*—Ha Tran Nguyen
*Assistant Examiner*—Trung Q. Nguyen
(74) *Attorney, Agent, or Firm*—Patterson & Sheridan LLP

(57) ABSTRACT

An improved prober for an electronic devices test system is provided. The prober is "configurable," meaning that it can be adapted for different device layouts and substrate sizes. The prober generally includes a frame, at least one prober bar having a first end and a second end, a frame connection mechanism that allows for ready relocation of the prober bar to the frame at selected points along the frame, and a plurality of electrical contact pins along the prober bar for placing selected electronic devices in electrical communication with a system controller during testing. In one embodiment, the prober is be used to test devices such as thin film transistors on a glass substrate. Typically, the glass substrate is square, and the frame is also square. In this way, "x" and "y" axes are defined by the frame. The electrical pins may be movable along the axial length of the prober bars, or may be selectively pushed down to contact selected contact pads on the substrate.

25 Claims, 12 Drawing Sheets

410
1300
1080
1028
1020
1028
1020
1020
1020
1028
1080
1028
1028
1020
y
x

U.S. PATENT DOCUMENTS 3,983,401 A 9/1976 Livesay
4,090,056 A 5/1978 Lockwood et al.
4,362,945 A 12/1982 Riecke
4,437,044 A 3/1984 Veith
4,471,298 A * 9/1984 Frohlich .................... 324/72.5
4,495,966 A 1/1985 Longamore
4,528,452 A 7/1985 Livesay
4,532,423 A 7/1985 Tojo et al.
4,684,808 A 8/1987 Plies et al.
4,725,736 A 2/1988 Crewe
4,740,705 A 4/1988 Crewe
4,760,567 A 7/1988 Crewe
4,761,607 A 8/1988 Shiragasawa et al.
4,764,818 A 8/1988 Crew
4,795,912 A 1/1989 Maschke
4,818,933 A 4/1989 Kerschner et al.
4,819,038 A 4/1989 Alt
4,843,312 A 6/1989 Hartman et al.
4,862,075 A 8/1989 Choi et al.
4,870,357 A 9/1989 Young et al.
4,899,105 A 2/1990 Akiyama
4,965,515 A 10/1990 Karasawa
4,983,833 A 1/1991 Brunner et al.
4,985,676 A 1/1991 Karasawa
4,985,681 A 1/1991 Brunner et al.
5,003,254 A * 3/1991 Hunt et al. ................. 324/754
5,081,687 A 1/1992 Henley et al.
5,107,206 A * 4/1992 Yanagi et al. ............... 324/754
5,124,635 A 6/1992 Henley
5,170,127 A 12/1992 Henley
5,175,495 A 12/1992 Brahme et al.
5,177,437 A 1/1993 Henley
5,220,285 A * 6/1993 Cerda ......................... 324/540
5,258,706 A 11/1993 Brunner et al.
5,268,638 A 12/1993 Brunner et al.
5,278,494 A 1/1994 Obigane
5,285,150 A 2/1994 Henley et al.
5,313,156 A 5/1994 Klug et al.
5,368,676 A 11/1994 Nagaseki et al.
5,369,359 A 11/1994 Schmitt
5,371,459 A 12/1994 Brunner et al.
5,414,374 A 5/1995 Brunner et al.
5,430,292 A 7/1995 Honjo et al.
5,432,461 A 7/1995 Henley
5,504,438 A 4/1996 Henley
5,528,158 A 6/1996 Sinsheimer et al.
5,530,370 A 6/1996 Langhof et al.
5,558,717 A 9/1996 Zhao et al.
5,621,333 A 4/1997 Long et al.
5,644,245 A 7/1997 Saitoh et al.
5,657,139 A 8/1997 Hayashi
5,691,764 A 11/1997 Takekoshi et al.
5,742,173 A 4/1998 Nakagomi et al.
5,774,100 A 6/1998 Aoki et al.
5,801,545 A 9/1998 Takekoshi et al.
5,801,764 A 9/1998 Koizumi et al.
5,834,007 A 11/1998 Kubota
5,834,773 A 11/1998 Brunner et al.
5,892,224 A 4/1999 Nakasuji
5,923,180 A 7/1999 Botka et al.
5,930,607 A 7/1999 Satou
5,936,687 A 8/1999 Lee
5,973,323 A 10/1999 Alder et al.
5,982,190 A 11/1999 Toro-Lira
6,033,281 A 3/2000 Toro-Lira
6,046,599 A 4/2000 Long et al.
6,075,245 A 6/2000 Toro-Lira
6,086,362 A 7/2000 White et al.
6,137,303 A 10/2000 Deckert et al.
6,145,648 A 11/2000 Teichman et al.
6,198,299 B1 3/2001 Hollman
6,265,889 B1 7/2001 Tomita et al.
6,281,701 B1 8/2001 Yang
6,288,561 B1 9/2001 Leedy
6,297,656 B1 10/2001 Kobayashi et al.
6,320,568 B1 11/2001 Zavracky
6,333,635 B1 * 12/2001 Lee et al. .................. 324/754
6,337,722 B1 1/2002 Ha
6,337,772 B2 1/2002 Uehara et al.
6,340,963 B1 1/2002 Anno et al.
6,343,369 B1 1/2002 Saunders et al.
6,356,098 B1 * 3/2002 Akram et al. ............... 324/765
6,362,013 B1 3/2002 Yoshimura
6,380,729 B1 4/2002 Smith
6,435,868 B2 8/2002 White et al.
6,450,469 B1 9/2002 Okuno
6,501,289 B1 12/2002 Takekoshi
6,528,767 B2 3/2003 Bagley et al.
6,559,454 B1 5/2003 Murrell et al.
6,566,897 B2 5/2003 Lo et al.
6,570,553 B2 5/2003 Hashimoto et al.
6,730,906 B2 5/2004 Brunner et al.
6,765,203 B1 7/2004 Abel
6,777,675 B2 8/2004 Parker et al.
6,828,587 B2 12/2004 Yamazaki et al.
6,833,717 B1 12/2004 Kurita et al.
6,873,175 B2 3/2005 Toro-Lira
6,992,290 B2 1/2006 Watanabe et al.
6,995,576 B2 2/2006 Imai
7,005,641 B2 2/2006 Nakasuji et al.
7,077,019 B2 7/2006 Weis et al.
7,084,970 B2 8/2006 Weis et al.
7,137,309 B2 11/2006 Weis et al.
7,180,084 B2 2/2007 Weis et al.
2001/0052788 A1 12/2001 Tomita
2002/0024023 A1 2/2002 Brunner et al.
2002/0034886 A1 3/2002 Kurita et al.
2002/0047838 A1 4/2002 Aoki et al.
2003/0209323 A1 11/2003 Yokogaki
2003/0218456 A1 11/2003 Brunner et al.
2004/0145383 A1 7/2004 Brunner et al.
2005/0040338 A1 2/2005 Weis et al.
2005/0179451 A1 8/2005 Brunner et al.
2005/0179452 A1 8/2005 Brunner et al.
2006/0038554 A1 2/2006 Kurita et al.

FOREIGN PATENT DOCUMENTS

DE 198 32297 9/2001
EP 0 204 855 A1 12/1986
EP 0 370 276 A1 1/1991
EP 0 402 499 9/1991
EP 0 537 505 11/1993
EP 0 523 594 12/1993
EP 0 614 090 9/1994
EP 0 542 094 A1 11/1994
EP 0 762 137 3/1997
EP 0 806 700 11/1997
EP 0 932 182 A2 7/1999
EP 0 999 573 5/2000
EP 1 045 425 10/2000
EP 1 233 274 8/2002
JP 60 039748 3/1985
JP 63 88741 4/1988
JP 63 88742 4/1988
JP 63 166132 7/1988
JP 63 318054 12/1988
JP 1 213944 8/1989
JP 1 307148 12/1989
JP 6 167538 6/1994
JP 7 302563 11/1995
JP 8 173418 7/1996
JP 8 289231 11/1996
JP 11284940 9/1999

| | | | |
|---|---|---|---|
| JP | 2000 180392 | | 6/2000 |
| JP | 2000 223057 | | 8/2000 |
| JP | 2000 268764 | | 9/2000 |
| JP | 2001 0033408 | | 2/2001 |
| JP | 2001 318116 | | 11/2001 |
| JP | 2001-318116 | | 11/2001 |
| JP | 2001 358189 | | 12/2001 |
| JP | 2002 039976 | | 2/2002 |
| JP | 2002 048740 | | 2/2002 |
| JP | 2002 257997 | | 9/2002 |
| JP | 2002 310959 | | 10/2002 |
| JP | 2002 343294 | | 11/2002 |
| JP | 2004 014402 | | 1/2004 |
| TW | 344486 | | 11/1998 |
| TW | 427551 | | 3/2001 |
| TW | 459140 | B | 10/2001 |
| TW | 473772 | | 1/2002 |
| TW | 511207 | | 11/2002 |
| TW | 512428 | | 12/2002 |
| TW | 536630 | | 6/2003 |
| TW | 2003-01535 | | 7/2003 |
| TW | 541430 | | 7/2003 |
| WO | WO 92 09900 | | 6/1992 |
| WO | WO 98/31050 | | 7/1998 |
| WO | WO 99/23684 | | 5/1999 |
| WO | WO 99/60614 | | 11/1999 |
| WO | WO 02/33745 | | 4/2002 |
| WO | WO 02/45137 | | 6/2002 |

OTHER PUBLICATIONS

Brunner, M., "TFT Array Testing: Replacing Mechanics by Electron Beam Deflection," AKTNews vol. 6, Apr. 2001, p. 15-17.

Invitation to Pay Additional Fees dated Oct. 21, 2003 for corresponding PCT application, PCT/US03/15903.

PCT International Serch Report for PCT/US03/15903, dated Jan. 16, 2004.

PCT English Translation of International Preliminary Exam Report for PCT/EP03/06481, dated Mar. 10, 2005.

Kumada, et al., "Non-Contact Array testers".

European Search Report for EP 03 026 267.9, dated Apr. 5, 2004.

Invitation to Pay Additional Fees for PCT/US04/043202 dated May 11, 2005.

U.S. Appl. No. 10/778,982, filed Feb. 12, 2004, Shinichi Kurita, et al., "Electron Beam Test System With Integrated Substrate Transfer Module."

U.S. Appl. No. 10/889,695, filed Jul. 12, 2004, Matthias Brunner, et al., "Configurable Proper For TFT LCD Array Tesing."

International Search Report for PCT/US05/26866, dated Aug. 30, 2006.

German Search Report, dated Jul. 18, 2003 for DE 102 53 717.8.

German Examination Report, dated Jul. 14, 2003 for DE 102 53 818.8.

European Search Report, dated Apr. 7, 2004 for EP 030 26 267.9.

PCT International Search Report & Written Opinion for PCT/US2004/043202, dated Jul. 28, 2005.

TIPO Official Action for Patent Application No. 94123638, Dated Dec. 25, 2006.

* cited by examiner 432
412
450
444
440
X
430

450
414
444
410
470
Z
472

1020
y
1022
1024
1023
160
152
1080
150
1026
x
1021
410
1000

CONFIGURABLE PROBER FOR TFT LCD ARRAY TEST

CROSS-REFERENCE TO RELATED APPLICATIONS

This application is a continuation-in-part of co-pending U.S. patent application Ser. No. 10/889,695, filed Jul. 12, 2004, entitled "Configurable Prober for TFT LCD Array Test", which is a continuation-in-part of U.S. patent application Ser. No. 10/778,982, filed Feb. 12, 2004 now U.S. Pat. No. 6,833,717, entitled "Electron Beam Test System with Integrated Substrate Transfer Module". The '982 application is incorporated by reference herein.

The '695 patent application claims benefit of and is a continuation-in-part of co-pending U.S. patent application Ser. No. 10/778,982, filed Feb. 12, 2004. That application is entitled "Electron Beam Test System with Integrated Substrate Transfer Module." That application is incorporated herein in its entirety by reference.

BACKGROUND OF THE INVENTION

1. Field of the Invention

Embodiments of the present invention generally relate to testing systems for electronic devices on substrates. In addition, embodiments of the present invention generally relate to an improved prober for conducting a thin film transistor liquid crystal display array test on a variety of flat panel substrate designs.

2. Description of the Related Art

Active matrix liquid crystal displays (LCDs) are commonly used for applications such as computer and television monitors, cell phone displays, personal digital assistants (PDAs), and an increasing number of other devices. Generally, an active matrix LCD comprises two glass plates having a layer of liquid crystal materials sandwiched therebetween. One of the glass plates typically includes a conductive film disposed thereon. The other glass plate typically includes an array of thin film transistors (TFTs) coupled to an electrical power source. Each TFT may be switched on or off to generate an electrical field between a TFT and the conductive film. The electrical field changes the orientation of the liquid crystal material, creating a pattern on the LCD.

In order to provide quality control for thin film transistors on a large area glass substrate, it is desirable to conduct a liquid crystal display "array test." The array test allows a TFT LCD manufacturer to monitor and correct defects in the pixels during processing. A known method of testing pixels is known as electron beam testing, or "EBT." During testing, each TFT is positioned under an electron beam. This is accomplished by positioning a substrate on a table positioned below the beam, and moving the table in "x" and "y" directions to sequentially position each TFT on the substrate below the electron beam test device. One such device which enables flat panel display fabricators to test devices formed on flat panels is a PUMA™ electron beam tester available from AKT, Inc., a subsidiary of Applied Materials, Inc. located in Santa Clara, Calif.

In order for the LCD array test to be conducted, a "prober" is used. A typical prober consists of a frame that usually covers the entire substrate under investigation. The frame has a plurality of electrical contact pins thereon at locations that match the contact pads of the substrate. Electrical connection to the pins is accomplished by fine wire connections to an electronics driver board. The board is usually software controlled.

In operation, the substrate is raised into contact with the prober. More specifically, the contact pads of the substrate are placed into contact with the electrical pins of the prober. The contact pads, in turn, are in electrical communication with a pre-defined set of the thin film transistors, or "pixels." An electrical current is delivered through the pins and to the contact pads. The current travels to and electrically excites the corresponding pixels. An electron beam senses voltages in the excited pixels in order to confirm operability of the various thin film transistors on the substrate.

In the past, each prober has been custom made for a particular display layout design. This means that each electrical device and substrate layout has required a different prober frame having the matching configuration for the device array. The result is that the purchaser of semiconductor fabrication machinery must also purchase a uniquely compatible prober in order to test the fabricated pixels.

Modification of an individual prober for a new device layout is expensive. Therefore, it is desirable to provide a prober that is configurable to match a different substrate sizes and different device layouts. It is also desirable to provide a prober that can be functionally adjusted for different display layouts or arrangements.

SUMMARY OF THE INVENTION

The present invention generally provides an improved prober for an electronic devices test system. The prober operates to test electronic devices such as pixels on a substrate. The prober is "configurable," meaning that it can be adapted for different device layouts, different display arrangements, and different substrate sizes. In one embodiment, the prober includes a frame. The frame receives at least one adjustable prober bar having a first end and a second end. A frame connection mechanism is provided that allows for attachment of the prober bar to the frame at selectable points along the frame. The prober also includes a plurality of electrical contact pins, or "probe pins," along the prober bar. The probe pins contact selected test pads on the substrate in order to place electronic devices on the substrate in electrical communication with a system controller during testing.

Probe pins are also placed along the prober bars. In one aspect, the probe pins are integral to the prober bars, meaning that they have a fixed axial position relative to the bars. In another embodiment, however, the probe pins are part of separate bodies referred to herein as "probe heads." The probe heads are movably attached to corresponding prober bars along the axial length of the bars. In this way, the position of the probe pins within the probe frame can be further adjusted for testing of different display sizes and device layouts. In still a different embodiment, multiple probe pins are disposed on fixed probe heads along the length of the prober frame. This permits the operator to select which probe pins to actuate in accordance with the location of the contact pads on a substrate.

Typically, the prober will be used to test devices on a glass substrate having multiple displays. Preferably, each of the electronic devices is a thin film transistor. Typically, the glass substrate and the frame are each rectangular or square. In this way, "x" and "y" axes are defined by the frame. In one aspect, the at least one prober bar is placed on the frame along the "y" direction, serving as a "y" bar.

In one arrangement, the frame has four sides representing two opposing sides. In addition, the frame connection mechanism may define a plurality of holes along an inner surface of the four sides of the frame for receiving the first and second ends of the prober bars, respectively. In one embodiment, each prober bar includes an end cap at each of the first and second ends, with each end cap configured to be attached to selected holes of the frame connection mechanism.

BRIEF DESCRIPTION OF THE DRAWINGS

So that the manner in which the above recited features of the present invention can be understood in detail, a more particular description of the invention, briefly summarized above, may be had by reference to embodiments, some of which are illustrated in the appended drawings. It is to be noted, however, that the appended drawings illustrate only typical embodiments of this invention and are therefore not to be considered limiting of its scope, for the invention may admit to other equally effective embodiments.

DETAILED DESCRIPTION

The present invention generally provides an improved prober for an electronic devices test system. For purposes of this disclosure, the term "test system" means any system that may be used to test electronic devices on a substrate. Such a test system may include optical inspection systems, electron beam test systems, systems that detect color changes, and others. The prober for the electronic devices test system is "configurable," meaning that it can be adapted for different device layouts and substrate sizes.

Figure 1:
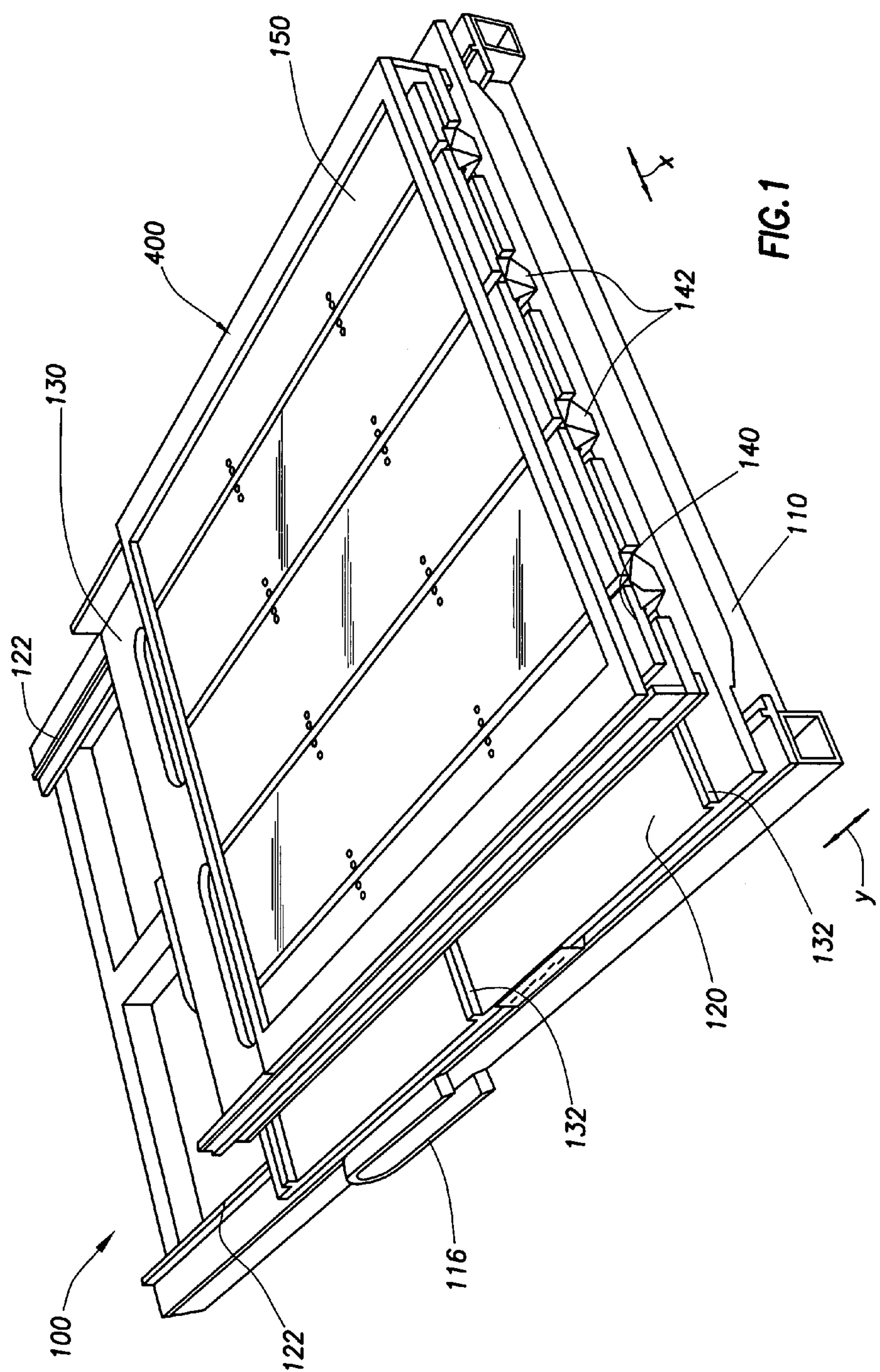
FIG. 1 presents a perspective view of a configurable prober, in one embodiment. The prober is part of an electronic devices test system. The prober is positioned on a test system table that moves the prober in "x" and "y" directions.

FIG. 1 presents a perspective view of a configurable prober 400, in one embodiment. The prober 400 is part of an electronics device test system 100. In one embodiment, the prober 400 is part of an electron beam test system 100, though other systems could be used. The prober 400 is positioned on a test system table 110 that moves the prober 400 in at least "x" and "y" directions. In the arrangement of FIG. 1, the table 110 defines a tubular frame fabricated from stainless steel. However, the scope of the present inventions is not limited by the configuration or material of the table 110. An optional cable carrier 116 is provided external to the table 110.

The table 110 supports various plates 120, 130, 140 that translate the prober 400 in different dimensions. The three plates 120, 130, and 140 are planar monoliths or substantially planar monoliths, and are stacked on one another. The three stacked plates are seen in cross-section in FIG. 2, which is a cross-sectional view of the illustrative test system 100 of FIG. 1.

In one aspect, each of the three plates 120, 130, 140 is independently movable along orthogonal axes or dimensions. The first plate supports the second 130 and third 140 plates, as well as the prober 400. The first plate moves the supported second 130 and third 140 plates along a "y" axis. FIG. 1 shows bearing surfaces 122, for moving the first plate 120. The linear bearing surfaces 122 are provided in the "y" axis for the first plate 120.

The second plate 130 supports the third plate 140, and moves the third plate 140 and prober 400 in an "x" axis. Linear bearing surfaces 132 are provided along the "x" axis for the second plate 130. The second plate 130 supports the prober 400 through a collar 135.

Finally, the third plate 140 supports the substrate. A substrate is shown at 150 in FIGS. 1 and 2. The third plate 140 moves the substrate 150 in a "z" axis. More specifically, the third plate 140 lifts the substrate 150 into contact with pogo pins (shown at 480 in FIG. 9) of the prober 400.

Figure 2:
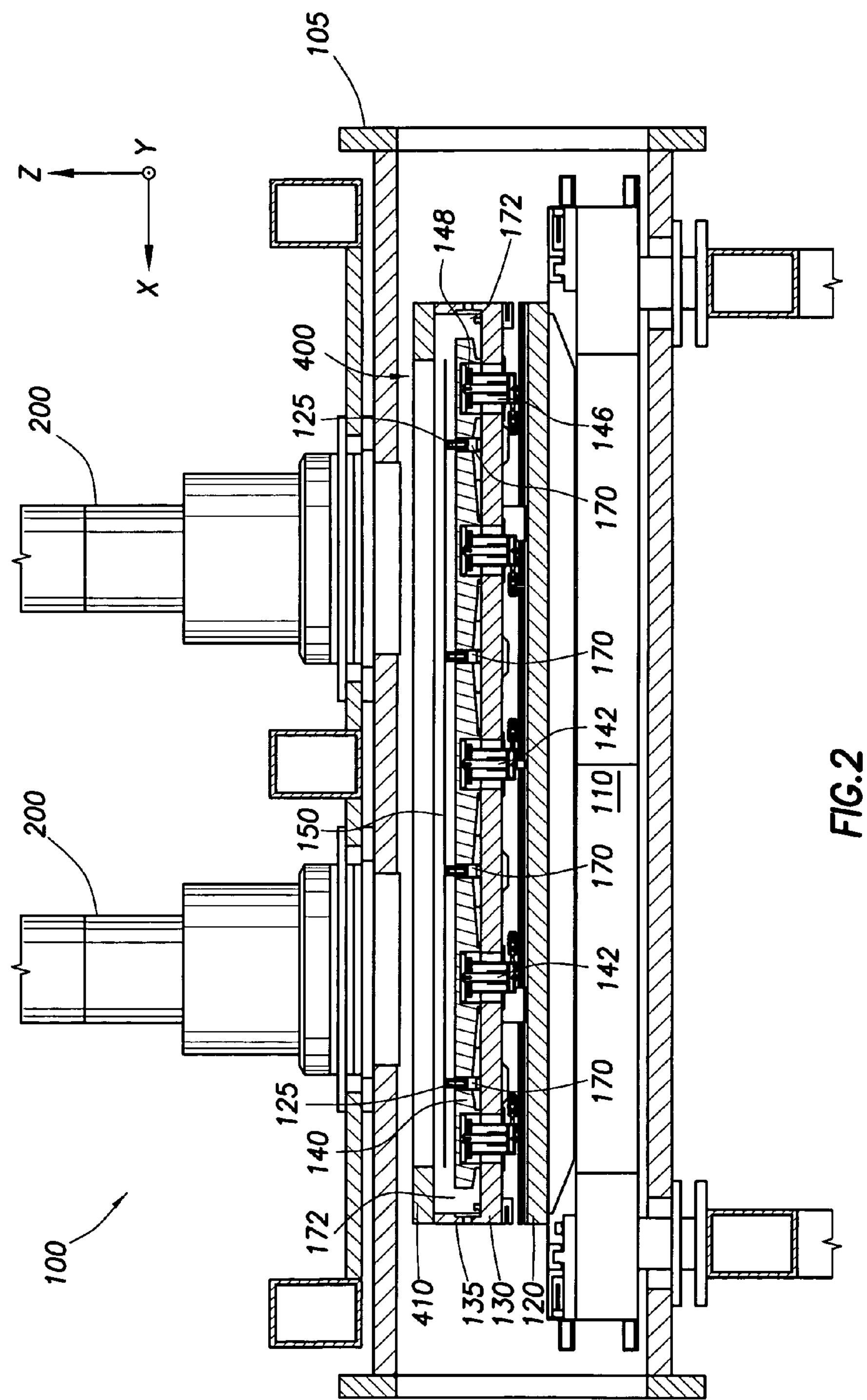
FIG. 2 is a cross-sectional view of an illustrative test system table. A prober is shown schematically on the table. In addition, electron beam test columns are seen over the prober. A substrate is placed between the test table and the prober.

As indicated, a substrate 150 is shown in FIGS. 1 and 2. The illustrative substrate 150 is a large area glass substrate that contains a plurality of conductive electronic devices. An example is a plurality of thin film transistors (TFT's). It is understood that the TFT's are quite small and will not be visible in the perspective view of the test system 100.

It is also understood that the test system 100 contains numerous other features and components. Where the test system is an electron beam test system, the system 100 may include a prober transfer assembly, a load lock chamber, a testing chamber and, optionally, a prober storage assembly, for example. The testing chamber will have electron beam columns for directing electron beams down onto the pixels under inspection. These various features are not shown in FIG. 1; however, electron beam columns are seen at 200 in the cross-sectional view of FIG. 2. Details of an exemplary electron beam test system containing such features are disclosed in the pending U.S. Patent Application entitled "Electron Beam Test System with Integrated Substrate Transfer Module." That application was filed on Feb. 12, 2004, and bears Ser. No. 10/778,982.

Referring again to FIG. 2, a cross-sectional view of the illustrative test system 100 of FIG. 1 is presented. The test system 100 again includes a test system table 110. The table 110 supports the first plate 120, the second plate 130, and the third plate 140. The first (or lower) plate 120 and the second (or intermediate) plate 130 each move linearly along a horizontal plane, but move in a direction orthogonal to one another. In contrast, the third (or upper lift) plate 140 moves in a vertical direction or the “z” direction. Plates 120, 130 are driven by a linear motor or other actuator. Linear actuators such as linear motors or hydraulic cylinder-and-piston arrangements (not shown) may be provided for translating the plates 120, 130.

The prober 400 is shown schematically on the table 110, supported by the plates 120, 130, 140. The plates 120, 130, 140 selectively translate the prober 400 in different dimensions. In the illustrative system 100, the prober 400 may be moved in “x,” “y” directions. Operation of the test system 100 in order to move the prober 400 is described in the pending ’982 Patent Application entitled “Electron Beam Test System with Integrated Substrate Transfer Module.” As noted above, the pending ’982 application is referred to and incorporated by reference herein to the extent its disclosure is not inconsistent with the present disclosure. FIG. 2 is a duplication of FIG. 5 from the pending ’982 application. For this reason, discussion of the system 100 shown in FIG. 2 herein is limited.

It should be noted that the test system 100 further includes an end effector 170. A portion of the end effector is shown in cross-section in FIG. 2. The end effector 170 transfers the substrates 150 in and out of the testing chamber. In operation, the end effector 170 may be extended from the testing chamber into an adjoining chamber or system such as a load lock chamber (not shown) to load a substrate. Likewise, the end effector 170 having a substrate loaded thereon may be extended from the testing chamber into the load lock chamber to transfer the substrate 150 to the load lock chamber. A motion device, such as a linear actuator, a pneumatic cylinder, a hydraulic cylinder, a magnetic drive, or a stepper or servo motor, for example may be coupled to the end effector 170 to assist this transfer. In one aspect, the end effector 170 includes a pair of bearing blocks 172 that permit the end effector 170 to move into and out of the testing chamber. Additional features of the end effector and the transfer of substrates are provided in the ’982 Patent Application.

The end effector 170 cooperates with the third plate 140 during substrate transfer. In this respect, the third plate contains one or more z-axis lifts 142 coupled to the plate 140. Each z-axis lift 142 is disposed within a channel 146. A bellows 148 is arranged about each lift 142 to reduce particle contamination within the testing chamber. The z-axis lift 142 moves up and down vertically and may be actuated pneumatically or electrically. The bellows 148, in turn, compress and expand in response to the movement of the corresponding lifts 142. In the view of FIG. 2, the upper lift plate 140 is in its lowered position. The substrate 150 is resting on pins 125 on the “x” plate 130.

The illustrative test system 100 of FIG. 2 also shows electron beam testing (EBT) columns 200. In this view, one pair of columns 200 is shown. However, there will typically be two (or possibly more) pairs of EBT columns. The EBT columns 200 are disposed on an upper surface of a chamber housing 105 and are attached to the housing 105. The housing 105 provides a particle free environment and encloses the prober 400 and table 110.

Figure 3:
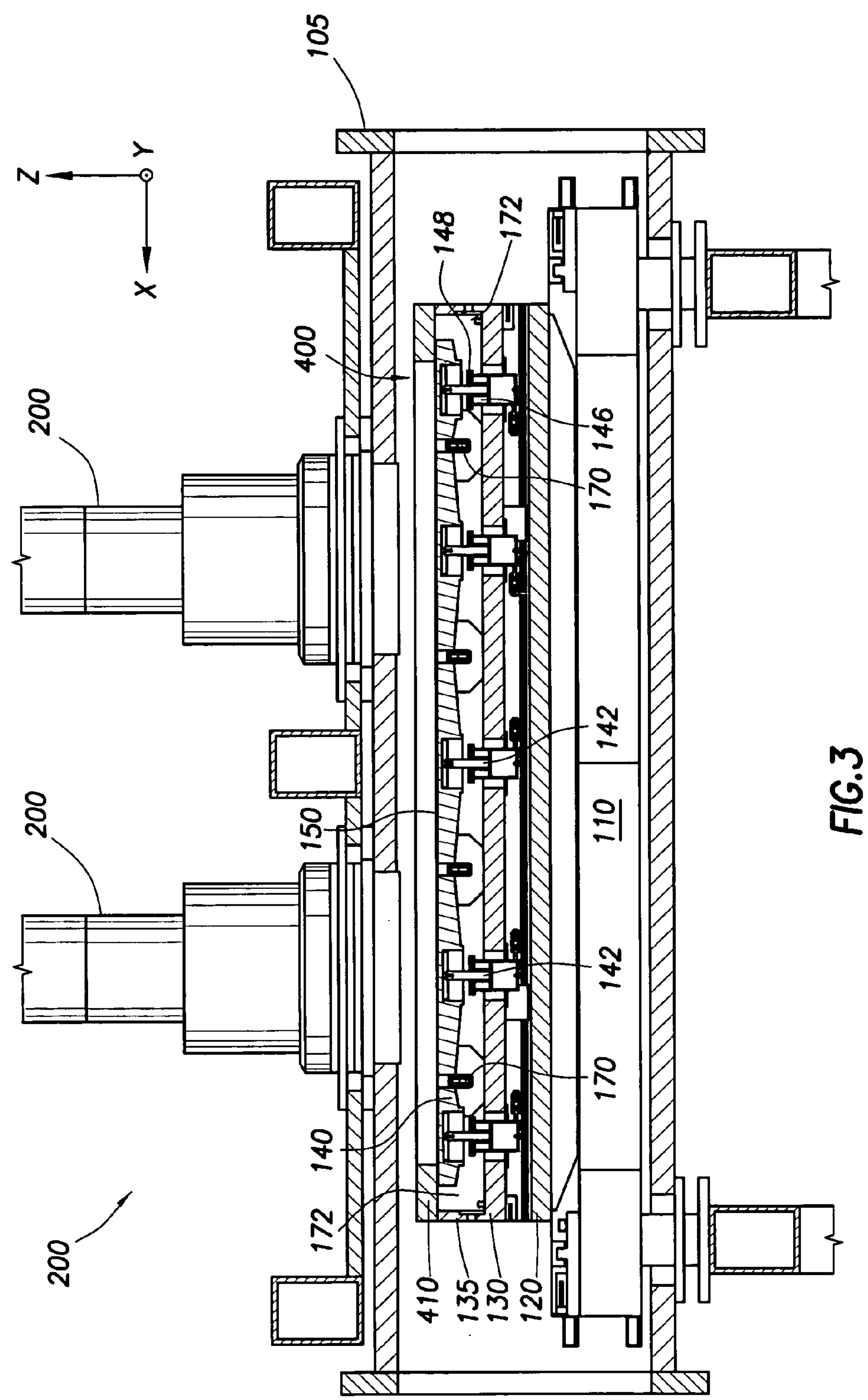
FIG. 3 shows the test system table of FIG. 2. In this cross-sectional view, the substrate has been raised in the "z" direction into electrical contact with the prober.

FIG. 3 shows the test system 100 of FIG. 2 in a test position. Here, the z-axis lift 142 has been actuated to raise the substrate 150. It can be seen that the substrate 150 has been raised into contact with the prober 400. More specifically, contact is made between the substrate 150 and pogo pins (not shown) on a bottom face of the prober 400. It is understood that in other test systems, the prober may instead by lowered into contact with the substrate; the present inventions are not limited as to the manner in which contact is achieved.

Figure 4:
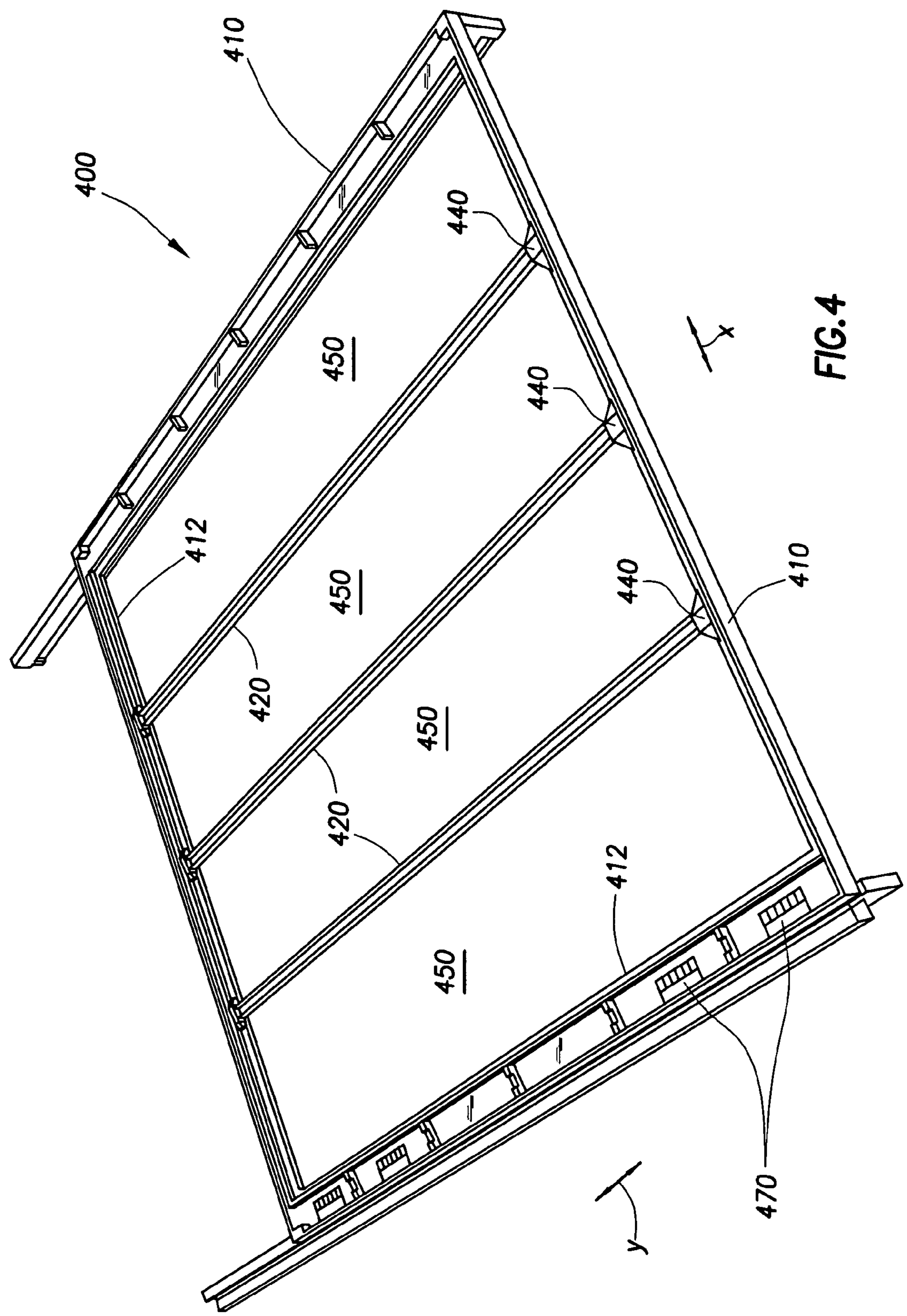
FIG. 4 presents a schematic view of a configurable prober, in one embodiment. Prober bars are shown within a universal frame in the "y" direction.

Moving now to FIG. 4, FIG. 4 presents a schematic view of a configurable prober 400, in one embodiment. The prober 400 has a frame 410. In the embodiment of FIG. 4, the frame 410 is a polygonal frame having four sides. In this particular arrangement, the frame is square, though other configurations may be provided such as rectangular. The frame 410 defines “x” and “y” directions or “axes.”

The prober 400 also includes one or more prober bars 420. In the view of FIG. 4, three separate prober bars 420 are shown within the frame 410; however, other numbers of prober bars 420 may be employed. Each of these prober bars 420 is positioned at a selected coordinate along the “x” axis, and is parallel to the “y” axis. In this orientation, the prober bars 420 are “y” prober bars. The areas defined between the prober bars 420 form test areas 450 (also shown in FIG. 7).

The position of the prober bars 420 along the frame 410 may be changed. In this respect, the connection between the respective prober bars 420 and the frame 410 is releasable and relocatable. To provide for this feature, a frame connection mechanism 412 is provided that allows for ready relocation of at least one prober bar 420 to the frame 410 at a selected coordinate along the “x” or “y” axes of the frame. In one embodiment, the frame connection mechanism 412 is a plurality of through-holes placed along or formed within the inner surface of the frame 410. Exemplary through-holes are shown at 414 in the enlarged view of FIG. 5. The through-holes 414 receive end caps 440 placed at opposing ends of the prober bars 420 which form part of the frame connection mechanism 412 as well.

Figure 6:
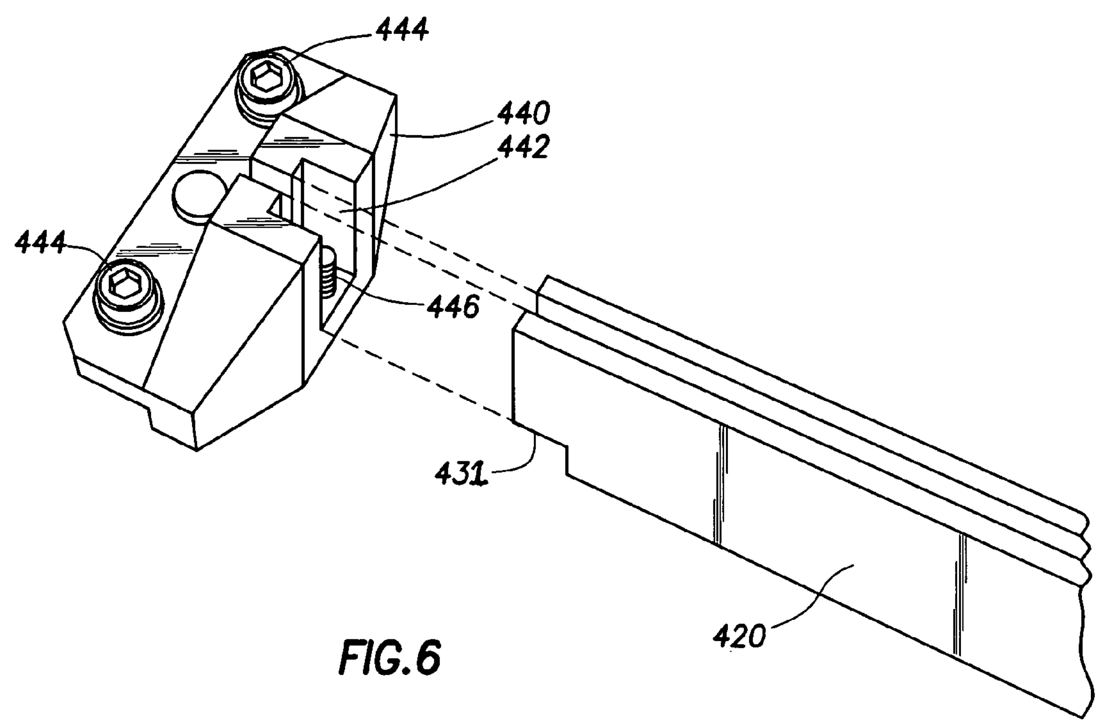
FIG. 6 shows the end cap of FIG. 5 exploded away from a prober bar.

FIG. 6 provides a perspective view of an end cap 440. The end cap 440 is exploded away from an end of a prober bar 420. The end cap 440 includes one or more connecting members 444 for connecting to the frame connection mechanism 412 of the frame 410. In the end cap 440 arrangement of FIG. 6, a pair of bolts is provided as the connecting members 444. The end cap 440 also has a channel 442 for receiving a shoulder 431 on the prober bar 420. An optional bolt 446 is provided in the channel 442 of the end cap 440. The bolt 446 is configured to threadedly connect to the prober bar 420 through a threaded opening (not shown) formed on the prober bar 420.

In order to relocate a prober bar 420 along the frame 410, the bolts 444 are backed out of the holes 414 of the frame 410, and then advanced into different holes 414 located along the frame 410. In this manner, the position of the prober bars 420 along the “x” axis of the frame 410 may be adjusted. This, in turn, permits the user to employ the same prober 400 for different substrate sizes and for different device configurations.

Figure 5:
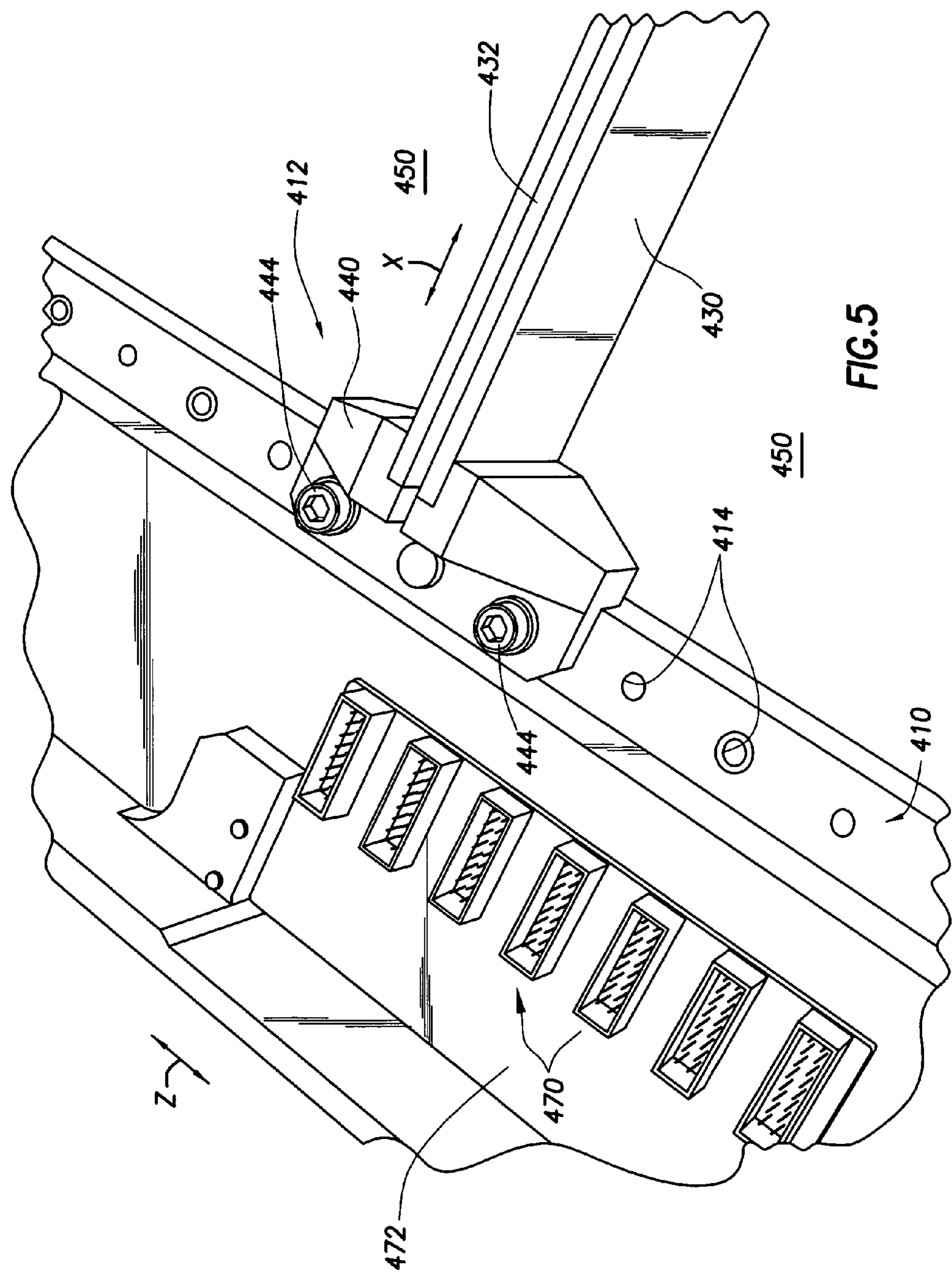
FIG. 5 provides a perspective view of a prober bar oriented along the "x" axis, with an end cap at an end of the prober bar. The end cap is releasably connected to the frame.

In accordance with the present invention, prober bars 420 may also be positioned in the “x” direction of the prober frame 410, meaning that the prober bars are oriented parallel to the “x” axis. FIG. 5 provides an enlarged perspective view of a prober bar 430, with an end cap 440 at an end of the prober bar 420. The end cap 440 is again connected to the frame connection mechanism 412 of the frame 410. In this orientation, the prober bar is an “x” prober bar labeled as 430, and can be moved to a different position along the “y” axis. If the dimensions of the frame 410 are different in the “x” and “y” directions, then the lengths of the “x” and “y” prober bars 430, 420 will also be different.

As an additional option, “x” prober bars 430 may be placed between “y” prober bars 420, or between a “y” prober bar 420 and the frame 410. In such an arrangement, a substantially shorter "x" prober bar would be employed.

As an additional option, the frame connection mechanism 412 may be adapted to position a prober bar 420 between through holes 414. For example, the end cap 440 may have different channels for incrementally re-positioning the bar 420 laterally. This permits fine tuning of the lateral position of the "y" prober bar 420 along the "x" axis.

Figure 7:
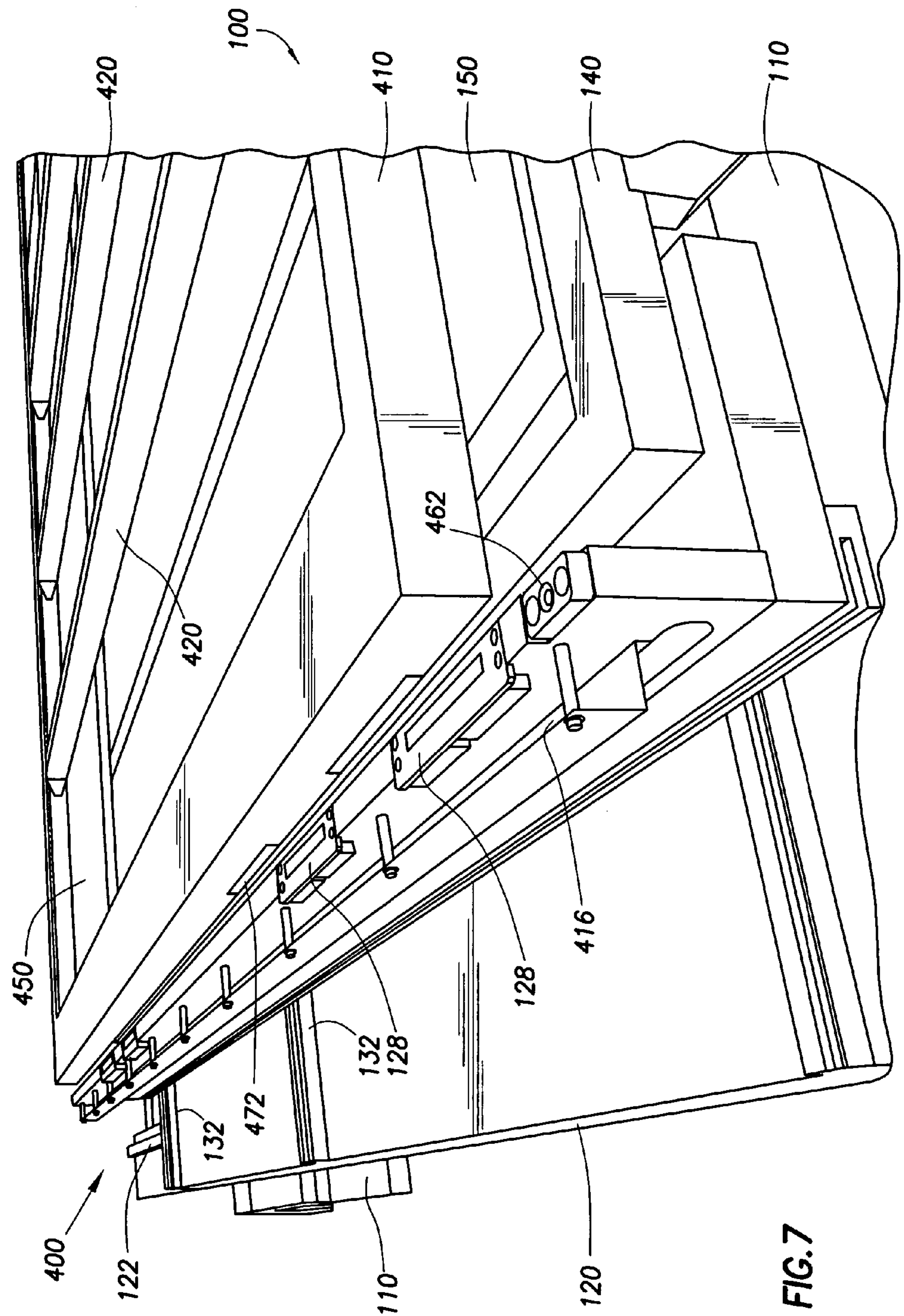
FIG. 7 is a partial exploded view of the prober of FIG. 4. The prober is above the base for the device testing system. Controller pads for the testing system are seen.

FIG. 7 provides a perspective view of the prober 400 of FIGS. 1 and 4 as part of a test system 100. It can be seen that the prober 400 has a plurality of electrical connection pads 472. The pads 472 are configured to place the frame 410 in electrical communication with a system controller (not shown) of the testing system 100. Each of the pads 472 has a plurality of "frame" pins 470 (seen more clearly in FIG. 8). Pads 472 are aligned with mating pads 128 on the intermediate "x" plate 130. The mating pads 128 include printed circuit boards that interface with the controller for the testing system 100. The pads 128 receive electrical signals that come from the controller and deliver them to the connected prober electrical connection pads 472. The detachable pin 470—pad 128 connection allows the prober 400 to be removed from the test system 100 for microscope operations and servicing.

It should be noted that the through-holes 414 in the frame 410 of FIG. 7 are not visible, as a cover has been temporarily placed on the prober frame 410. The cover is used during testing to shield the wires (not shown) that travel from the probe pins (shown at 480 in FIG. 9, and discussed below) to the printed circuit board 128. Without the cover, there is the potential that the E-Beam column 200 will charge up the wires. However, a cable channel for electrical connections is seen at 416 in FIG. 7.

Figure 8:
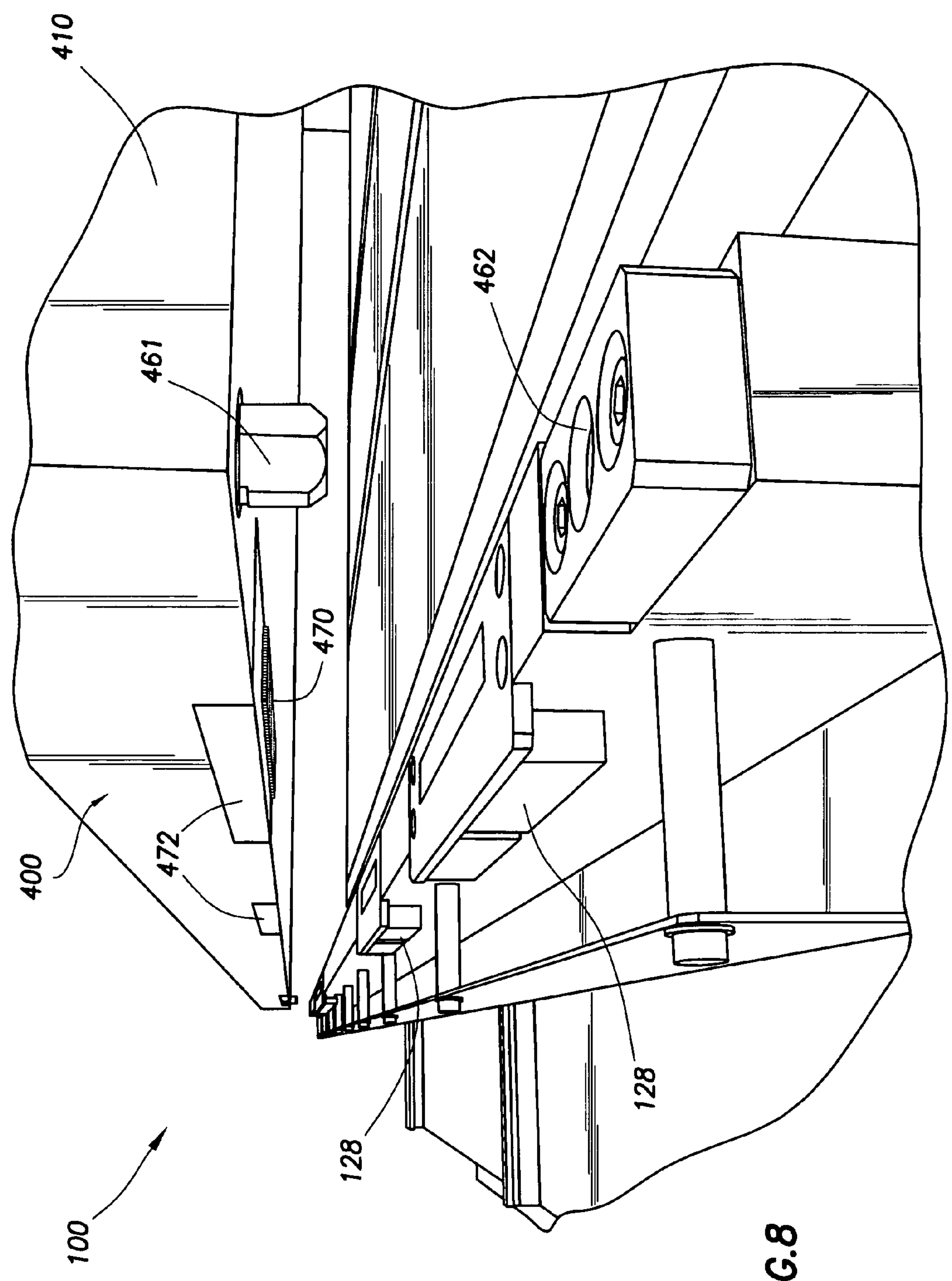
FIG. 8 provides a further enlarged and exploded view of the electrical connection between the prober and the base for the device testing system.

FIG. 8 provides a further enlarged view of the prober 400 of FIG. 7. In this view, the electrical connection between the prober frame 410 and the test system 100 is more clearly seen. In this respect, electrical frame connection pads 472 are seen aligned over test system pads 128. In addition, an alignment pin 461 is seen at a corner of the prober frame 410. The alignment pin 461 is tapered so as to be guided into a locating seat 462 provided in the upper "x" plate 130. Bolts (not seen) secure the locating seat to the upper "ye" plate 140.

The frame electrical connection is done in such a way as to allow for a wide range of possible display layouts, such as from 25 to 1 display per sheet, and from 14" to about 50" display. More generally, the electrical connection is configurable for any display configuration that the prober frame size will accommodate.

Figure 9:
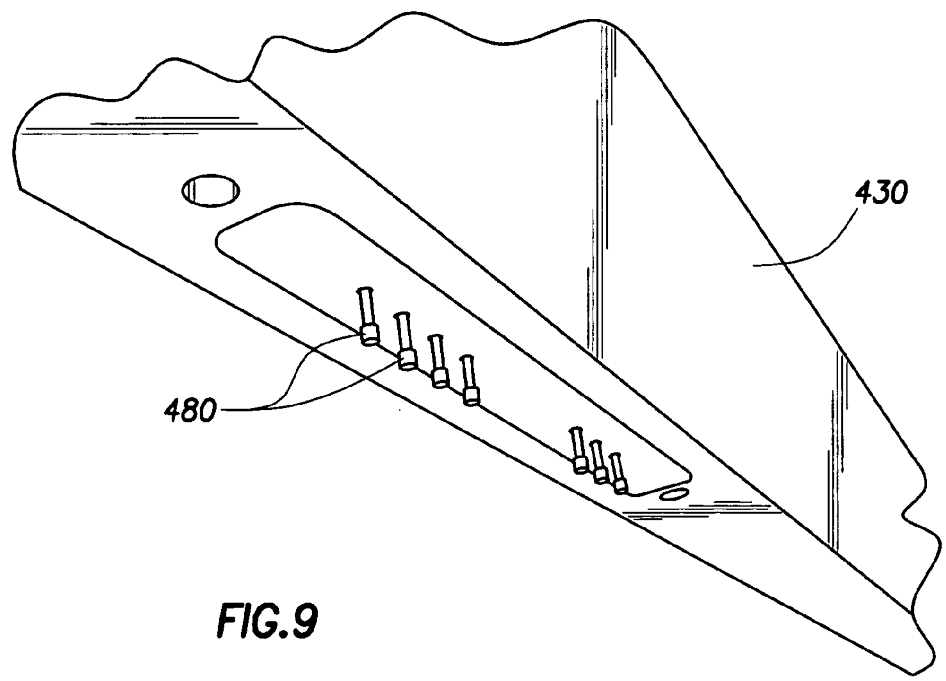
FIG. 9 presents a bottom view of an exemplary prober bar. A plurality of electrical contact pins are seen extending from the prober bar.

The prober 400 also has a plurality of electrical contact pins, referred to as probe pins 480. One type of probe pin 480 is a pogo pin. The probe pins 480 are placed along each of the prober bars 420, 430. FIG. 9 presents a bottom view of an exemplary prober bar 430. A plurality of electrical probe pins 480 are seen extending from the prober bar 430. While the probe pins 480 are shown along an "x" prober bar 430, it is understood that pogo pins would also be used for a "y" prober bar 420.

The probe pins 480 may be selectively configured during initial prober setup. The probe pins 480 may be press-fit into holes along the prober bars 420. In the prober arrangement 400 of FIG. 4, the pins 470 are integral to the prober bars 420. In this respect, the prober 400 is "semi-universal." However, as will be discussed in connection with the prober bars 1020 of FIGS. 10 through 13, a fully "universal"prober 1000 may be provided in which probe heads and connected probe pins may be moved relative to the bars 1020.

The probe pins 480, 1080 are configured to place the frame 410 in electrical communication with selected pixels or TFT's (or other devices) formed on the substrate 150. The probe pins 480, 1080 may extend sidewards from the prober bars 420, 430, 1020 or may extend below the bars 420, 430, 1020. In the arrangement of FIG. 9, the pins 480 extend downward. However, in the prober arrangement 1000 discussed with FIG. 10, the pins 1080 are shown extending to the side for illustration.

The probe pins 480, 1080 in turn, are in electrical communication with the controller via the frame pins 470 and connecting pads 128 As the substrate 150 is urged against the prober 400 (shown in FIG. 3), electrical contact between the probe pins 480 and the contact pads (not shown) on the substrate 150 is made. The probe pins 480 are in electrical communication with the system controller, while the contact pads are in electrical communication with the devices on the substrate 150. Consequently, the controller may apply a voltage to a selected pixel or monitor each pixel for changes in attributes, such as voltage, during testing.

In one test protocol, the substrate 150 is tested by sequentially impinging at least one electron beam emitted from columns 200 (shown in FIG. 3) on discrete portions or pixels composing the thin film transistor matrix. After the TFT's are tested, the substrate table 110 (with supported plates 120, 130) moves the substrate 150 to another discrete position within the testing chamber so that another pixel on the substrate 150 surface may be tested. Additional details concerning electron beam testing are provided in the referenced '982 Patent Application. However, it is noted that the present disclosure provides for a selectively configurable prober 400, rather than a fixed "picture frame" prober, as disclosed in FIG. 10A of the '982 Patent Application.

Figure 10:
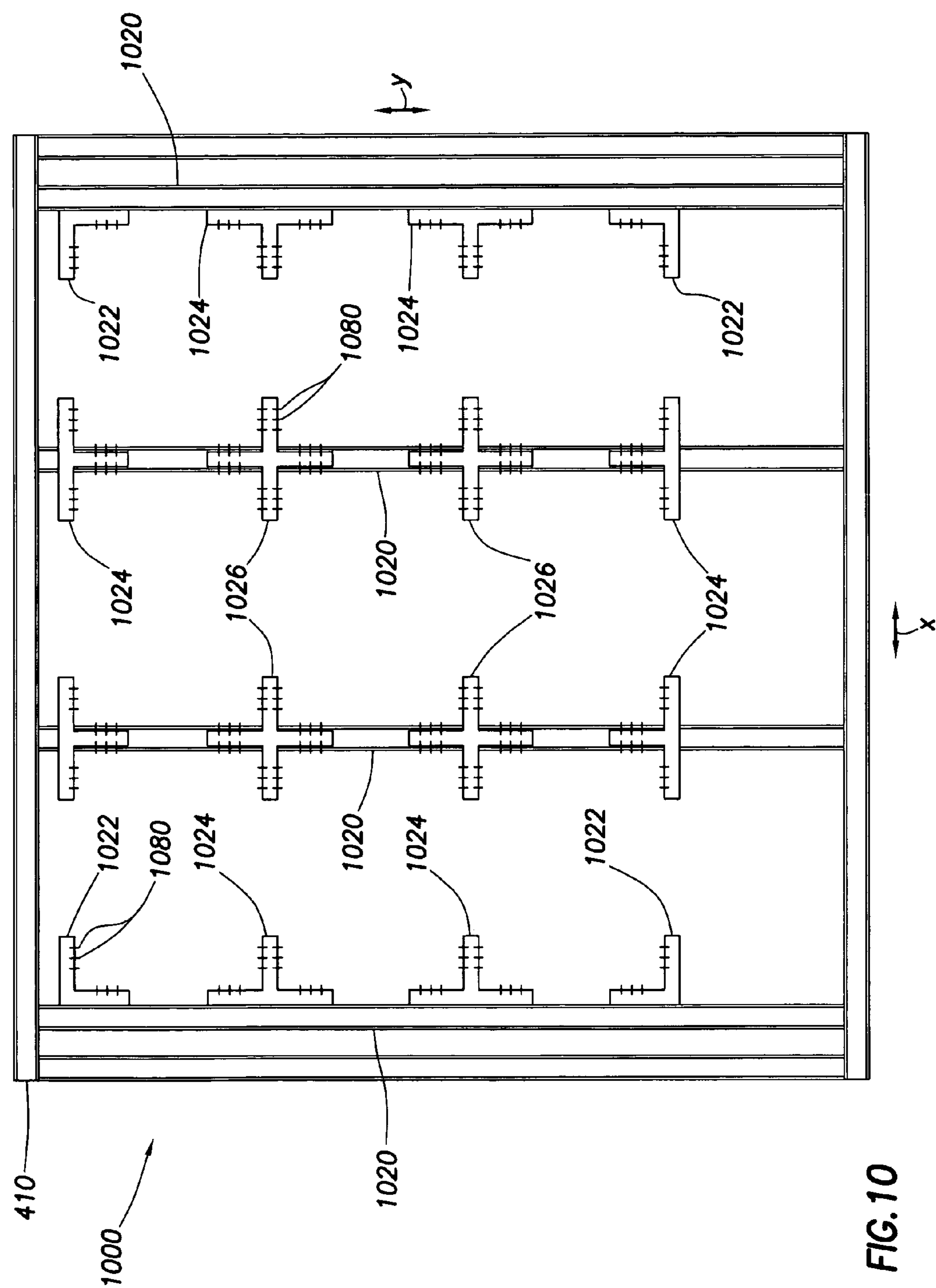
FIG. 10 provides a plan view of a prober in an alternate arrangement. Multiple prober bars are shown within a configurable prober frame.

FIG. 10 provides a plan view of a prober 1000 in an alternate embodiment. As with prober 400 of FIG. 4, the prober 1000 includes a frame 410. One or more prober bars 1020 is configured to be placed within the prober frame 410. The prober bars 1020 are generally dimensioned in accordance with the bars 420 of FIG. 4. In this way, the bars 1020 may be releasably attached to the frame 410.

It can be seen in FIG. 10 that the probe frame 410 defines "x" and "y" axes, and that the prober bars 1020 are oriented along the "y" axes. Thus, the bars serve as "y" bars. However, the prober bars 1020 may also be dimensioned to extend along the "x" axis. Alternatively, smaller length "x" prober bars (not shown in FIG. 10) may be positioned between "y" oriented prober bars.

In the alternate prober embodiment 1000 shown in FIG. 10, one or more probe heads are movably mounted on the bars 1020. In one aspect, each of the probe heads is "T" shaped so that it may be generically employed along any axial position along any bar 1020. However, it is preferred that various configurations for probe heads be employed. In FIG. 10, various probe heads are shown, including "L" shaped probe heads 1022, "T" shaped probe heads 1024, and "+" shaped probe heads 1026. Each of the two outer bars 1020 has a pair of "L" shaped probe heads 1022, and a pair of inner "T" shaped probe heads 1024. At the same time, there is one, two or more inner probe bars 1020, with each inner prober bar 1020 having a pair of "T" shaped probe heads 1024 and a pair of inner "+" shaped probe heads 1026. The "+" shaped heads 1026 are preferably used in the middle of the glass in the center gap between four displays. The "T" shaped heads 1024 are preferably used between two displays at the glass edge. The "L" shaped heads 1022 are preferably used at a corner of the glass. The prober head can be shaped to match the location of the contact pads 152.

Each of the probe heads 1022, 1024, 1026 includes one or more probe pins 1080 which make electrical contact with the substrate (shown at 150 in FIG. 10). More specifically, the probe pins 1080 contact pads 152 (seen in FIG. 11) placed along the substrate 150 for electrical testing. It is again understood that contact pads 152 are fabricated into the substrate 150 at discrete locations to enable display testing. Typically, the substrate contact pads 152 are 2 mm×2 mm in cross-section.

The probe heads 1022, 1024, 1026 are preferably fabricated from aluminum, aluminum oxide, or other nonmagnetic material that can electrically isolate the probe pins 480. It is desirable to avoid charging up the heads 1022, 1024, 1026 in the event a beam 200 hits a head.

The bars 1020 are configured to permit the positions of the various probe heads 1022, 1024, 1026 to be adjusted along the lengths of the bars 1020. The purpose is to selectively and accurately place the probe pins 1080 over the corresponding substrate pads 152 so that electrical communication between the prober 1000 and the substrate 150 can be obtained.

In one arrangement, the bars 1020 have guide mechanisms for allowing axial movement of the probe heads 1022, 1024, 1026. For example, the guide mechanisms may define rails or a guide channel (such as channel 432 of FIG. 5) for receiving the probe heads 1022, 1024, 1026. A securing mechanism may be used to releasably clamp or fasten the various probe heads 1022, 1024, 1026 along the bars 1020. Thus, at the determined location where the probe pins 480 lie over the substrate pads (shown at 152 in FIG. 11), the probe heads 1022, 1024, 1026 are locked down to fix their position.

It is to be understood that the present disclosure is not limited to the manner in which the probe heads 1022, 1024, 1026 attach to the prober bars 1020. The probe heads 1022, 1024, 1026 may be attached adjacent to, below, or above the prober bars 1020, and may be of any configuration so long as the contact pins 1080 electrically contact the substrate pads 152 during testing. The use of probe heads 1022, 1024, 1026 allows for efficient testing of substrates and display sections of different sizes. Further, the use of the outer prober bars 1020 allows the frame 410 to optionally not include its own probe pins since ideally the outermost contacts need to be adjustable. It is also understood that the position of the probe heads 1022, 1024, 1026 may be adjusted either manually or mechanically.

Figure 11:
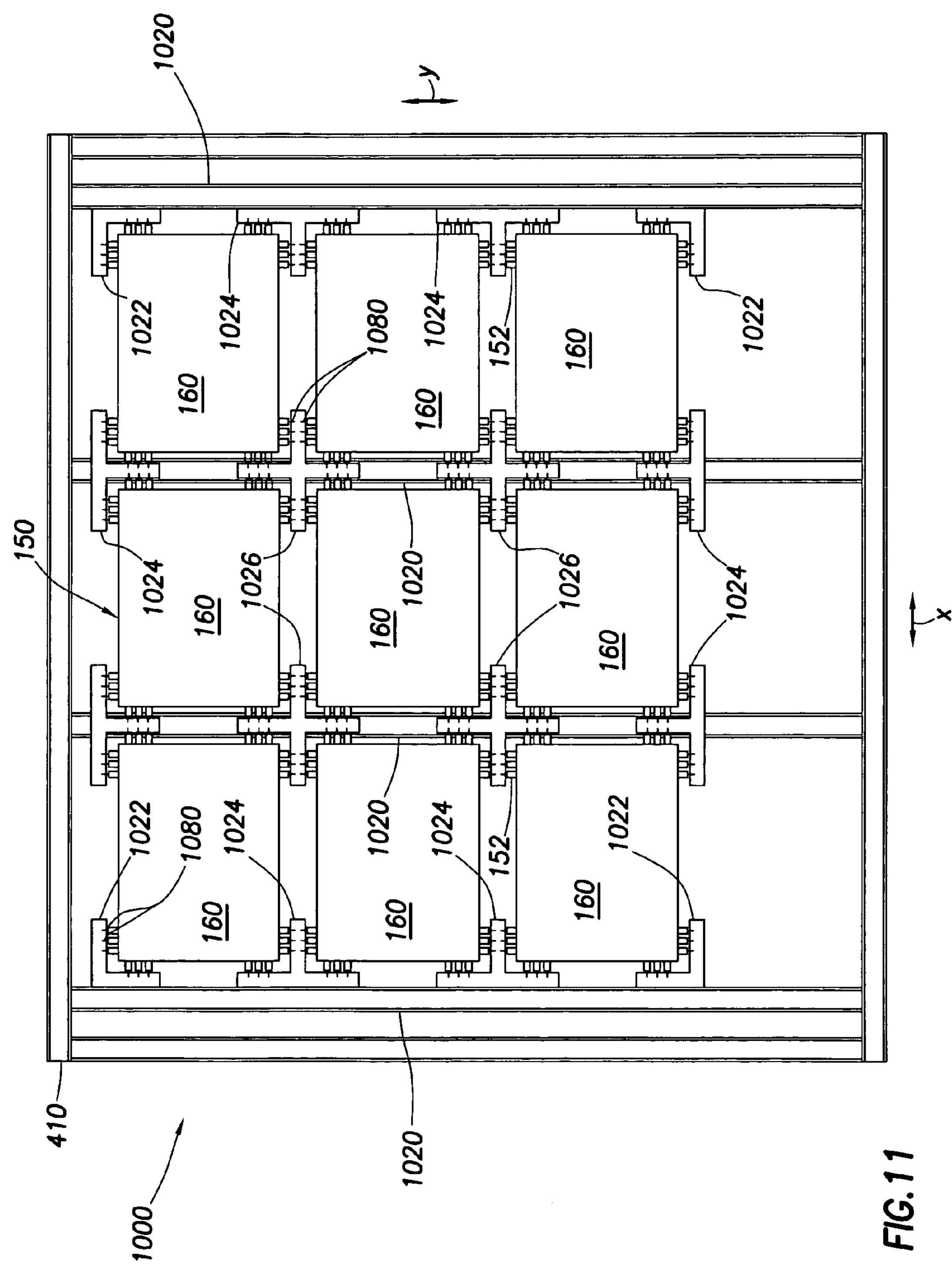
FIG. 11 illustrates the prober bars of FIG. 10 positioned over a large-area glass substrate for testing.

FIG. 11 illustrates the prober bars 1020 of FIG. 10 having been positioned within a prober frame 410. Here, the prober frame 410 has been placed over a large-area glass substrate 150 for testing. Of course, it is understood that other types of substrates, such as a polymer substrate, may be tested. Four separate prober bars 1020 are shown within the frame 410, dividing the substrate into nine separate panels 160. Each substrate 150 may include one or more displays 160 depending on the end use of the display. Displays may serve as laptop notebook computer screens, small or large flat screen TV's, cell phone displays, or other electronic screens. Anywhere from generally one to 25 displays may be formed on a single substrate 150. The probe pins 1080 make contact with each display 160 on the substrate 150 during testing.

Figure 12:
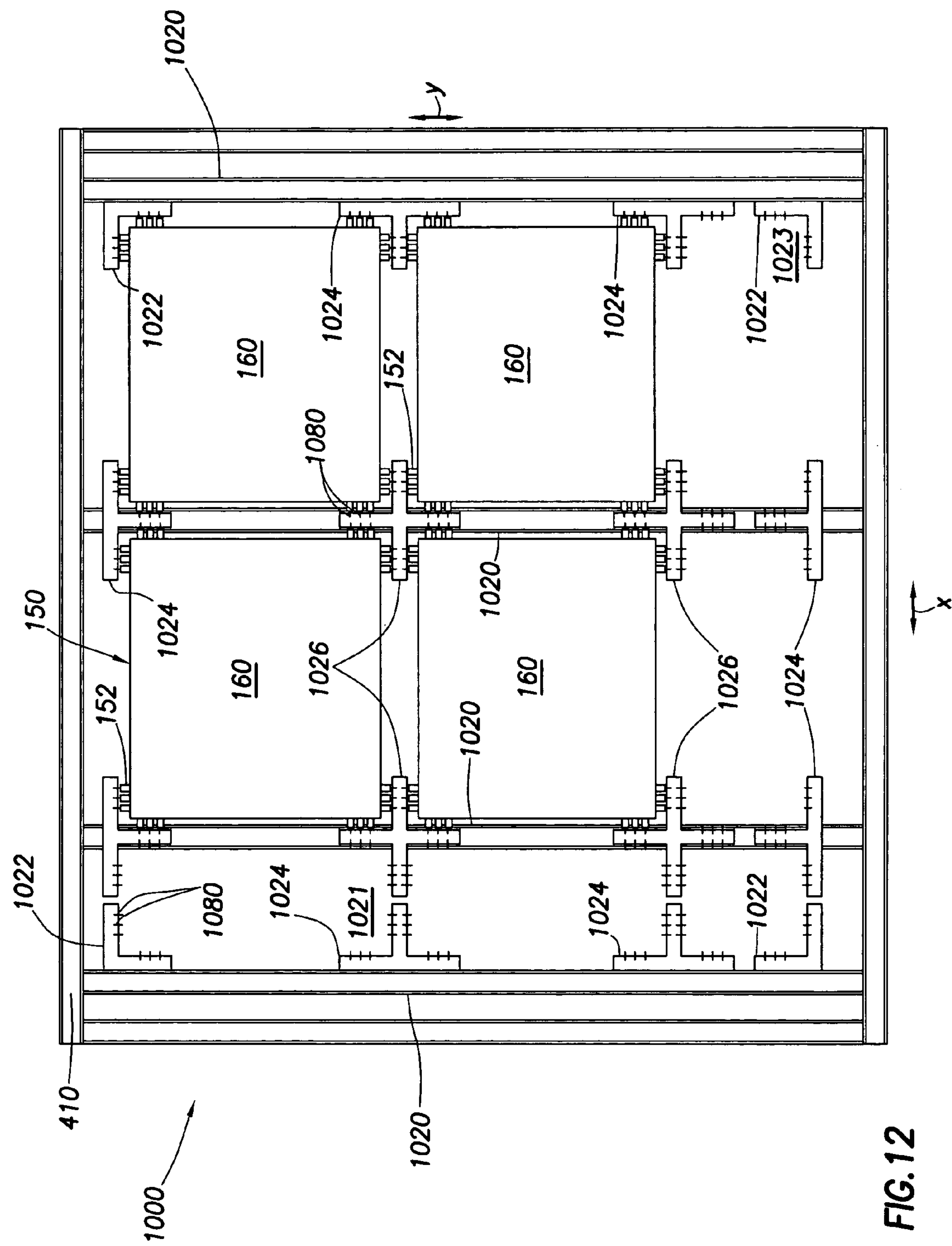
FIG. 12 shows the prober bars and probe heads reconfigured for different display layouts.

FIG. 12 shows that the prober bars 1020 and probe heads 1022, 1024, 1026 may be reconfigured for different substrate sizes. In this instance, only three prober bars 1020 are employed for display testing. In addition, only three probe heads 1022, 1024, 1026 are employed along each bar 1020. The extra prober bar 1020 and probe heads 1022, 1024, 1026 may be set aside in areas 1021 and 1023, respectively, for later use in testing other displays. Areas 1021 and 1023 may thus be reserved within the frame 410 for any unused prober bars or probe heads.

Figure 13:
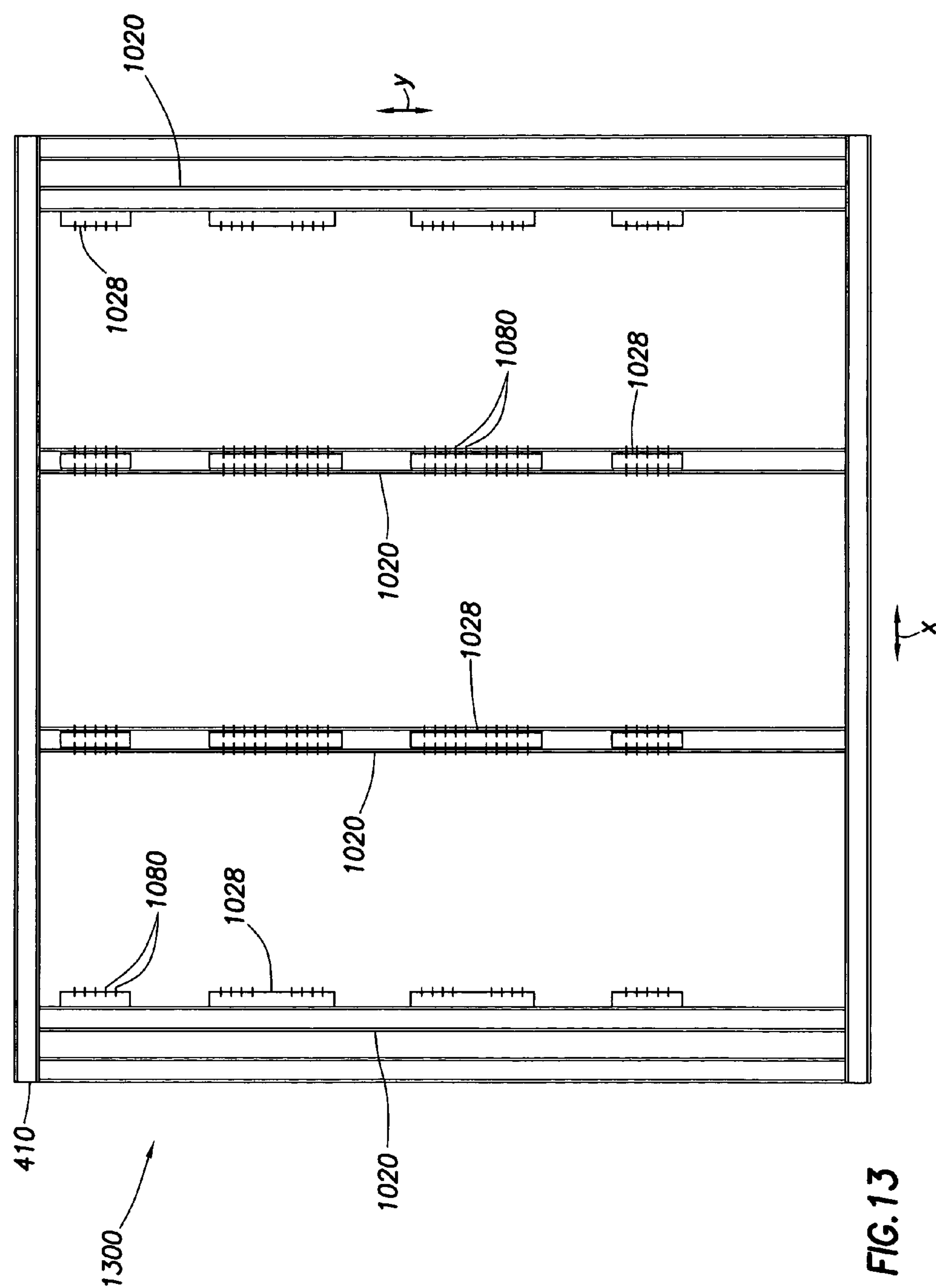
FIG. 13 is a plan view of an alternate embodiment of a prober.

FIG. 13 provides a plan view of a prober 1300 in yet an additional alternate arrangement. Four prober bars 1020 are seen within a prober frame 410. Linear probe heads 1028 are provided along the prober bars 1020. The probe heads 1028 are generally "I" shaped, meaning that they are linear or substantially linear. The "I" probe heads 1028 may also be mixed with "L" shaped probe heads 1022, "T" shaped probe heads 1024, and "+" shaped probe heads 1026 as desired for display testing. Otherwise, with only probe heads 1028, the displays may have pads only on the left or right sides, but not on the tops or bottoms.

In the prober arrangement 1300 of FIG. 13, the position of the prober heads 1028 may be axially adjusted along the length of the bars 1020. However, it is understood that the axial positions of the prober heads 1028 may alternatively be fixed. In order to accommodate displays that have contact pads of different axial positions, multiple pins 1080 may be placed along the length of the prober frame. Alternatively, multiple pins 1080 may be placed on various prober heads 1028. In either arrangement, the pins 1080 may be selectively pushed down or retracted so that only those pins 1080 in position over the contact pads 152 will contact the substrate 150 during testing. In this instance, the pins 1080 may be pushed down manually, or may be pushed down by a piston arrangement (not shown) in the test chamber.

Various embodiments of the present invention are provided herein. For example, a prober frame 410 is provided of sufficient universal size to accommodate large area glass substrates of any dimension, such as substrates having a cross-sectional area greater than 1.5 meters$^2$. When a user is faced with electron beam testing of a substrate having a different dimension or a different device layout or having different display sizes, then the user may adjust the location of the bars 420 or 430 without having to purchase an entire new prober. Where additional bars are needed, then additional bars can be purchased at an expense that is much less than an entire new prober. Alternatively, bars 1020 may be provided that have movable probe heads 1022, 1024, 1026 therealong. Alternatively, bars 1020 may be provided that have a fixed linear probe head 1028 but in which pins along the length of the probe head 1028 may be selectively actuated for contact with corresponding contact pads 152.

In addition, an electronic devices test system 100 has been described. The test system 100 is used to test electronic devices on a substrate, such as a glass substrate 150. The test system 100 utilizes a configurable prober 400 as described above in its various embodiments. The test system 100 includes both the prober 400 and the test system table 110. In one aspect, the test system 100 further has one or more electron beam columns.

A method for testing electronic devices is also provided. The method includes the steps of providing a test system table 110 in a test system 100; placing a "y" table 120 on the test system table 110, the "y" table 120 being selectively movable along the test system table 110 parallel to a "y" axis; placing an "x" table 130 on the "y" table 120, the "x" table 130 being selectively movable along the "y" table 120 parallel to an "x" axis; placing a configurable prober 400 on the "x" table 130; and placing a substrate 150 to be tested above the "x" table 130, the substrate 150 having contact pads (not visible) and a plurality of electronic devices (also not visible) in electrical communication with selected contact pads.

The prober 400 is in accordance with the prober 400 described above, in its various embodiments. Generally, the prober 400 has a frame 410, at least one prober bar 420 or 430 having a first end and a second end, a frame connection mechanism 412 that allows for ready relocation of the at least one prober bar 420 or 430 to the frame 410 at a selected coordinate along the frame 410, and a plurality of pogo pins 480 along the at least one prober bar 420 or 430 for placing selected electronic devices in electrical communication with a system controller during testing. In one aspect, the method further includes the step of placing at least some of the plurality of electrical pins 480 in electrical communication with the contact pads.

Preferably, the method further includes the step of placing a "z" plate 140 on the "x" plate 130. In this arrangement, the substrate 150 is placed on the "z" plate 140. In one embodiment, the method further includes the step of raising the "z" plate 140 in order to raise the substrate 150 to place the pins 480 in electrical communication with the contact pads. Preferably, the substrate 150 is a glass plate, and each of the electronic devices is a thin film transistor.

In another aspect of the method, axially adjustable probe heads, e.g., probe head 1022, may be placed along one or more prober bars 1020. Alternatively, bars 1020 may be provided that have a fixed linear probe head 1028 but in which pins along the length of the probe head 1028 may be selectively actuated for contact with corresponding contact pads 152.

While the foregoing is directed to embodiments of the present invention, other and further embodiments of the invention may be devised without departing from the basic scope thereof. The scope of the inventions is determined by the claims that follow.

We claim:

1. A configurable prober for an electronic device test system, comprising:

a frame;

at least one prober bar within the frame having a first end and a second end;

a frame connection mechanism that allows for ready relocation of the at least one prober bar to the frame at a selected coordinate along the frame; and a plurality of probe pins along the at least one prober bar for placing selected electronic devices in electrical communication with a system controller during testing, wherein the electronic devices are located on a glass substrate having contact pads that are in electrical communication with selected electronic devices and selected probe pins contact the substrate at selected ones of the contact pads.

2. The configurable prober of claim 1, wherein:

each of the electronic devices is a thin film transistor.

3. The configurable prober of claim 1, wherein:

the frame also comprises a plurality of electrical probe pins for providing electrical communication between the substrate, the prober and the system controller.

4. The configurable prober of claim 1, wherein:

the probe pins are movable along an axial length of the at least one prober bar.

5. The configurable prober of claim 1, wherein:

the probe pins may be selectively pushed down or retracted in order to contact selected contact pads on the substrate.

6. The configurable prober of claim 5, wherein:

the probe pins are positioned onto probe heads fixedly positioned along the length of the one or more prober bars.

7. The configurable prober of claim 1, wherein:

the frame is a polygonal frame defining at least "x" and "y" directions; and the at least one prober bar may be selectively placed on the frame parallel to the "y" direction and designated as a "y" prober bar, or placed on the frame parallel to the "x" direction and designated as an "x" prober bar.

8. The configurable prober of claim 1, wherein:

the frame is a polygonal frame defining "x" and "y" directions; and the at least one prober bar is placed on the frame in the "y" direction and is designated as a "y" prober bar.

9. A configurable prober for an electronic device test system, wherein comprising:

a frame;

at least one prober bar within the frame having a first end and a second end;

a frame connection mechanism that allows for ready relocation of the at least one prober bar to the frame at a selected coordinate along the frame; and a plurality of probe pins along the at least one prober bar for placing selected electronic devices in electrical communication with a system controller during testing, wherein:

the frame has four sides representing two opposing sides and defining "x"and "y" coordinates; and the frame connection mechanism defines a plurality of holes along an inner surface of the four sides of the frame for receiving the first and second ends of the at least one prober bar, respectively.

10. A configurable prober for an electronic device test system, comprising:

a frame;

at least one prober bar within the frame having a first end and a second end;

a frame connection mechanism that allows for ready relocation of the at least one prober bar to the frame at a selected coordinate along the frame; and a plurality of probe pins along the at least one prober bar for placing selected electronic devices in electrical communication with a system controller during testing, wherein the frame also comprises a plurality of electrical probe pins for providing electrical communication between the substrate, the prober and the system controller and the frame connection mechanism further comprises an end cap placed along each of the first and second ends of the at least one prober bar, with each end cap configured to be received by selected holes of the frame connection mechanism.

11. The configurable prober of claim 10, wherein:

each end cap is configured to receive a prober bar at more than one lateral location relative to the selected holes of the frame connection mechanism.

12. A configurable prober for an electronic device test system, comprising:

a frame, wherein the frame is a polygonal frame defining "x" and "y" directions;

at least one prober bar within the frame having a first end and a second end, wherein the at least one prober bar is placed on the frame in the "y" direction and is designated as a "y" prober bar;

a frame connection mechanism that allows for ready relocation of the at least one prober bar to the frame at a selected coordinate along the frame;

a plurality of probe pins along the at least one prober bar for placing selected electronic devices in electrical communication with a system controller during testing;

at least one "x" prober bar having a first end and a second end oriented along the "x" direction, with the first end of each "x" prober bar being releasably connected to the frame, and the second end of the "x" prober bar being releasably connected to one of the at least one "y" prober bars; and wherein each of the "y" prober bars further comprises a bar connection mechanism that allows for ready relocation of the at least one "x" prober bar to the "y"prober bar at selected points along the "y" prober bar.

13. A configurable prober for an electronic device test system, comprising:

a frame;

at least one prober bar within the frame having a first end and a second end;

a frame connection mechanism that allows for ready relocation of the at least one prober bar to the frame at a selected coordinate along the frame; and a plurality of probe pins along the at least one prober bar for placing selected electronic devices in electrical communication with a system controller during testing, wherein:

the electronic devices are located on a glass substrate that comprises a plurality of displays;

the at least one prober bar comprises at least two probe heads, the at least two probe heads being selectively positioned and movable along an axial length of the corresponding prober bar; and the at least one prober bar further comprises a plurality of electrical probe pins disposed on the at least two probe heads for providing electrical communication between selected displays, the prober, and the system controller.

14. The configurable prober of claim 13, wherein:

at least one of the at least two probe heads is "I" shaped, and is configured to be placed between two adjacent displays on the glass substrate.

15. A configurable prober for an electronic device test system, comprising:

a frame;

at least one prober bar within the frame having a first end and a second end;

a frame connection mechanism that allows for ready relocation of the at least one prober bar to the frame at a selected coordinate along the frame; and a plurality of probe pins along the at least one prober bar for placing selected electronic devices in electrical communication with a system controller during testing, wherein:

the electronic devices are located on a glass substrate that comprises a plurality of displays;

the glass substrate comprises at least one contact pad in electrical communication with selected electronic devices;

the at least one prober bar comprises at least two "I" shaped probe heads, fixed along an axial length of the corresponding prober bar; and the at least one prober bar further comprises a plurality of electrical probe pins disposed on the at least two probe heads for providing electrical communication between selected contact pads, the prober and the system controller, with the electrical probe pins being selectively pushed down or retracted to contact corresponding contact pads on the displays.

16. A configurable prober for a thin film transistor (TFT) test system, with TFT devices being located on a large area glass substrate defining multiple displays, the configurable prober comprising:

a four-sided polygonal frame defining an "x" axis and a "y" axis;

at least two prober bars within the frame;

a frame connection mechanism that allows for ready relocation of each of the prober bars to the frame at selected points along the "x" axis of the frame; and a plurality of electrical probe pins along each of the at least two prober bars for placing selected electronic devices on the displays in electrical communication with a system controller during testing.

17. The configurable prober of claim 16, wherein:

each of the at least two prober bars comprises at least two probe heads, the at least two probe heads being selectively positioned and movable along an axial length of the corresponding prober bar, wherein the at least two probe heads are "I" shaped, and are configured to be placed between two adjacent displays on the glass substrate.

18. An electronic device test system, comprising:

a test system table;

a configurable prober, the prober comprising:

a frame;

at least one prober bar positioned within the frame;

a frame connection mechanism that allows for ready relocation of the at least one prober bar to the frame at a selected coordinate along the frame; and a plurality of contact pins along the at least one prober bar for placing selected electronic devices in electrical communication with a system controller during testing; and one or more electron beam columns.

19. The electronic devices test system of claim 18, wherein:

the electronic devices are located on a glass substrate.

20. The electronic devices test system of claim 18, wherein:

each of the electronic devices is a thin film transistor.

21. A prober bar, for an electronic device test system having a system controller, the prober bar comprising:

a first end and a second end;

a plurality of probe pins along an axial length of the prober bar for placing selected electronic devices in electrical communication with the system controller during testing, wherein:

the prober bar is movably mounted at selected coordinates within a frame through a frame connection mechanism, the electronic devices are located on a glass substrate having contact pads that are in electrical communication with selected electronic devices; and selected probe pins contact the substrate at selected ones of the contact pads.

22. The prober bar of claim 21, wherein:

each of the electronic devices is a thin film transistor.

23. The prober bar of claim 21, wherein:

the probe pins are movable along an axial length of the at least one prober bar.

24. The prober bar of claim 21, wherein:

the probe pins may be selectively pushed down or retracted in order to contact selected contact pads on the substrate.

25. The prober bar of claim 24, wherein:

the probe pins are positioned onto probe heads fixedly positioned along the length of the one or more prober bars.

* * * * *

UNITED STATES PATENT AND TRADEMARK OFFICE

CERTIFICATE OF CORRECTION

PATENT NO. : 7,355,418 B2
APPLICATION NO. : 10/903216
DATED : April 8, 2008
INVENTOR(S) : Brunner et al.

It is certified that error appears in the above-identified patent and that said Letters Patent is hereby corrected as shown below:

Page 2

In the References Cited:

Please add --EP 0523584 1/1993--;

Please add --EP 1045426 10/2000--;

In the Claims:

Column 12, Claim 9, Line 14, please delete “wherein”.

Signed and Sealed this

Eleventh Day of November, 2008

JON W. DUDAS
*Director of the United States Patent and Trademark Office*